US005739052A

United States Patent [19]
Krishnan et al.

[11] Patent Number: 5,739,052
[45] Date of Patent: Apr. 14, 1998

[54] APPARATUS AND METHOD FOR DETECTING DEFECTS IN INSULATIVE LAYERS OF MOS ACTIVE DEVICES

[75] Inventors: Srikanth Krishnan, Richardson; Jeffrey A. McKee, Grapevine, both of Tex.

[73] Assignee: Texas Instruments Incorporated, Dallas, Tex.

[21] Appl. No.: 707,576

[22] Filed: Sep. 4, 1996

Related U.S. Application Data

[62] Division of Ser. No. 475,246, Jun. 7, 1995, abandoned, which is a division of Ser. No. 224,947, Apr. 8, 1994, Pat. No. 5,596,207.

[51] Int. Cl.$^6$ .................. H01L 21/66; G01R 31/02; G01R 31/26; G01R 31/12
[52] U.S. Cl. .................. 438/17; 324/548; 324/754; 324/765
[58] Field of Search .................. 437/8, 170, 171, 437/172, 919; 148/DIG. 162; 324/548, 754, 765; 438/17, 18

[56] References Cited

U.S. PATENT DOCUMENTS

| | | | |
|---|---|---|---|
| 4,760,032 | 7/1988 | Turner | 437/8 |
| 4,812,885 | 3/1989 | Riesmenschneider | 357/23.5 |
| 5,420,513 | 5/1995 | Kimura | 324/765 |
| 5,598,102 | 1/1997 | Smayling et al. | 324/765 |

*Primary Examiner*—Brian Dutton
*Attorney, Agent, or Firm*—Gerald E. Laws; C. Alan McClure; Richard L. Donaldson

[57] ABSTRACT

A technique for quantifying the effect of plasma etching during the formation of MOS transistors avoids the problems of prior techniques. A modified MOS capacitor 40 comprising a dielectric 12 separating a conductive plate 18 having a conductive sidewall 24 from a conductive substrate 10 is formed using the same or similar steps as a MOS transistor. Dielectric layer 12, such as oxide, is formed over a portion of conductive substrate 10. Conductive capacitor plate 18 is formed over a portion of the dielectric layer 12 using a plasma etch to remove unwanted material. After forming capacitor plate 18, the area of capacitor plate 18 is modified to encompass a peripheral oxide region 20. The modification consists of placing a conductive sidewall 24 of the same material as capacitor plate 18 or of other conductive materials around the periphery of capacitor plate 18. Electrical characterization is performed on modified MOS capacitor 40 yielding information about damage to the oxide in peripheral region 24 caused by the plasma etch. Modified MOS capacitor 40 can be used to compare plasma chemistries, detect oxide trenching, detect etchant loading and determine the effect of process hardware changes, for example. It can especially account for oxide loss in tight geometry features and in regimes where optical measurement techniques are unreliable.

8 Claims, 4 Drawing Sheets

APPARATUS AND METHOD FOR DETECTING DEFECTS IN INSULATIVE LAYERS OF MOS ACTIVE DEVICES

This is a division of application Ser. No. 08/475,246, filed Jun. 7, 1995 now abandoned, which is a divisional of application Ser. No. 08/224,947, filed Apr. 6, 1994, now U.S. Pat. No. 5,596,207.

BACKGROUND OF THE INVENTION

1. Field of the Invention

This invention relates to semiconductor integrated circuits and more specifically relates to quantifying the effect of plasma etching on, and during the formation of, MOS devices.

2. Brief Description of the Prior Art

During the manufacture of an integrated circuit, layers of material are formed by deposition on a substrate and then etchants are used to remove unwanted portions of each layer. The material layers may be deposited by sputtering, evaporation or growth, and the etchant may be a liquid or a plasma. Typically, the deposition and etch steps are selectively repeated successively to form transistors, interconnections, and other selected components of the integrated circuit. While a layer is being etched, an underlying, previously deposited layer may be damaged or otherwise deleteriously affected.

An MOS transistor, formed as described above, may comprise a thin gate oxide separating and insulating a conductive gate from a semiconductive channel region. Damage to the gate oxide layer during plasma etch of the gate may cause a voltage breakdown in the gate oxide when the MOS transistor is operated. Several techniques have been used to attempt to detect damage to oxide layers using devices such as Schottky barriers, capacitors and transistors. However, none of these techniques directly addresses detection of damage to the oxide at the periphery of a MOS transistor gate.

The primary damage caused by etching a conductive layer to form the gate is usually weakened gate dielectric at the periphery of the gate, oxide thinning over wider areas of the gate oxide beyond the periphery of the gate, and "trenching" of the gate oxide at the periphery of the gate or in areas beyond the periphery of the gate. Microtrenches are formed when the etching process removes all of the oxide from a small area or "punches through" the oxide to expose the silicon substrate. The process engineer is interested in detecting and minimizing damage to the gate oxide in order to improve reliability and performance of the MOS device.

Currently, the process engineer has limited means to detect damage to gate oxide layers, such as (a) breakdown measurements on blanket wafers (unpatterned wafers) to detect damage to the oxide layer resulting from general exposure to the etchant, (b) optical photometry measurements of surface index of refraction to detect damage to the oxide layer in patterned wafers, and (c) electron microscopy (SEM/TEM) cross sections to visually determine trenching. Breakdown measurements on a blanket wafer determine if damage to the oxide has occurred anywhere on the wafer, but does not specifically evaluate damage around the edges of an etched structure. Photometry measures the surface index of refraction, and damage to the oxide layer may be inferred from the results, but areas between device structures cannot be adequately resolved. Electron microscopy requires cross-sectioning the integrated circuit, so only damage to the oxide located along the cross-section will be detected. These techniques provide, at best, rough damage estimates and are inadequate for evaluating advanced small geometry processes due to a general lack of sensitivity and an inability to resolve areas between tightly spaced devices, in the case of photometry. Additionally, they are of little use for monitoring a production process since they require special test wafers or rely on destructive testing of a wafer.

It is accordingly a goal of the present invention to provide a means for detecting damage to gate oxide due to plasma etching that is applicable to the evaluation of new processes for forming small geometry integrated circuits as well as to processes which are currently being used for production of integrated circuits.

Other goals and advantages will be apparent to those of ordinary skill in the art having reference to the following figures and specification.

SUMMARY OF THE INVENTION

A new monitoring technique has been devised to quantify the effect of a plasma etch on the oxide at the periphery of a gate of a MOS transistor. The monitor employs a MOS capacitor comprising a thin oxide layer which separates a conductive plate from a semiconductive substrate. The oxide layer is equivalent to the gate oxide layer of a MOS transistor and the conductive plate is formed in the same manner as the gate of the MOS transistor by the plasma etch under investigation. After delineating the capacitor with the plasma etch, the area of the capacitor is modified to encompass the peripheral region. The modification is achieved by placement of a conductive sidewall spacer of the same gate material or other conductive materials around the periphery of the conductive plate. Electrical characterization may be performed on the resulting modified MOS capacitor to yield information on peripheral damage, such as trenching and oxide integrity in the vicinity of the gate region.

BRIEF DESCRIPTION OF THE DRAWINGS

Other features and advantages of the present invention will become apparent by reference to the following detailed description when considered in conjunction with the accompanying drawings; in which.

DESCRIPTION OF AN EMBODIMENT OF THE INVENTION

Figure 1A:
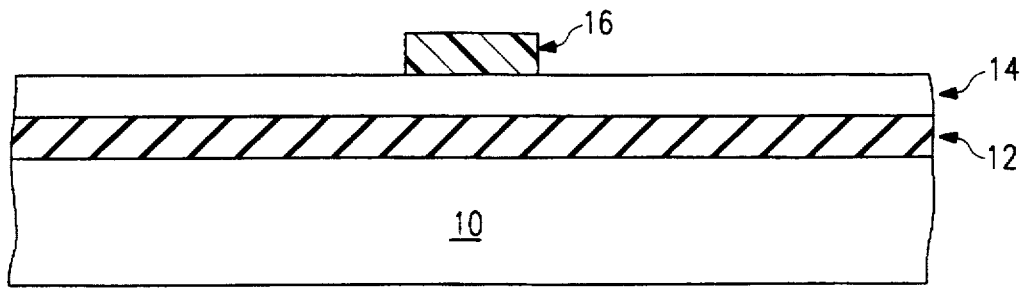
FIGS. 1a–1e are cross-sectioned elevational views of a semiconductor substrate illustrating a preferred method of constructing a modified MOS capacitor according to the present invention using maskless etching.

An embodiment of the invention is now described. FIG. 1e shows a cross-sectional view of an integrated circuit formed in accordance with the invention containing a modified MOS (herein called "MMOS") capacitor 40. MMOS capacitor 40 has a plate 18 formed of conductive material, e.g. polysilicon. Plate 18 may simulate the gate of an MOS transistor and will be referred to as gate 18 hereafter. Gate 18 is formed over an oxide layer 12 and comprises a generally planar element which may be generally parallel to a substrate 10 and may have peripheral edges, including those shown at 18a and 18b in FIG. 1e, which may be generally normal to the planes of the layer 12 and the substrate 10. Oxide layer 12 may simulate the gate oxide of a MOS transistor. Oxide layer 12 overlies the semiconductor substrate 10. The gate 18, which is otherwise configured and formed according to the prior art, is modified by the addition of a conductive sidewall 24, shown as sidewall portions 24a and 24b, which is in contact with the peripheral edges 18a and 18b of gate 18. The sidewall 24 is formed of a conductive material, e.g. polysilicon. The modified gate is denoted by the reference numeral 26.

Referring to FIGS. 1a–1e, a preferred process for forming the MMOS capacitor 40 of FIG. 1e is described.

Figure 1B:
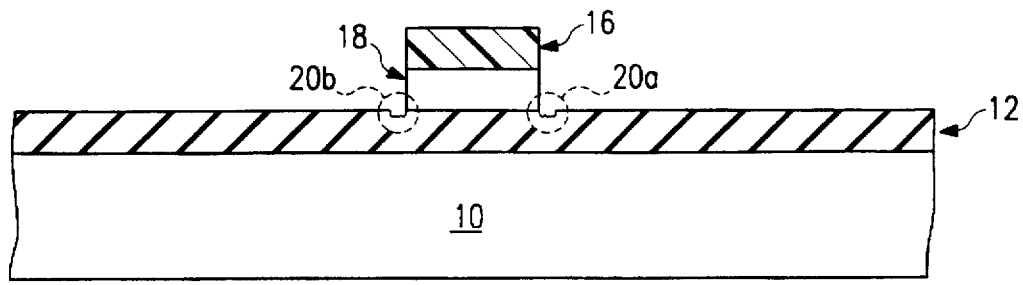
Figure 1C:
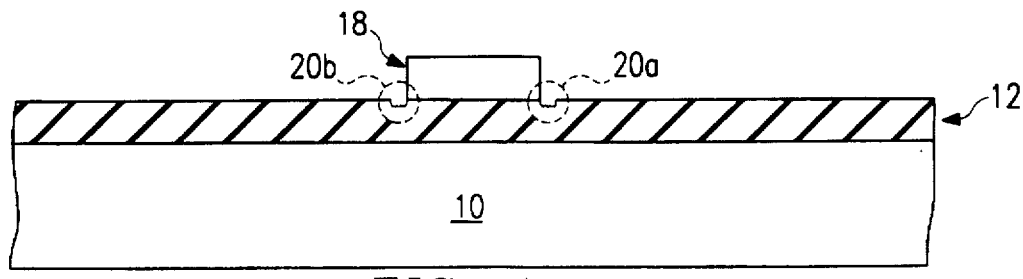
Figure 1D:
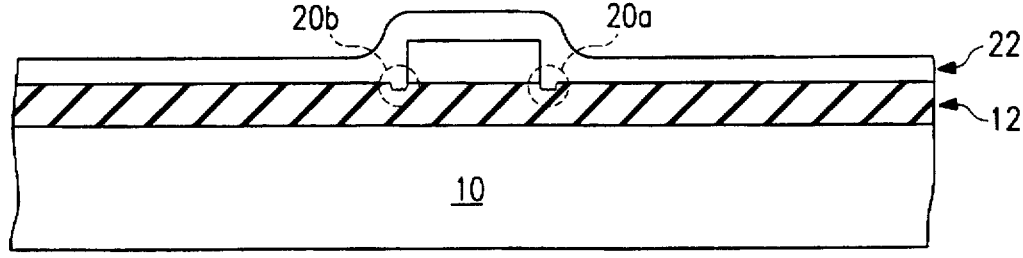
Figure 1E:
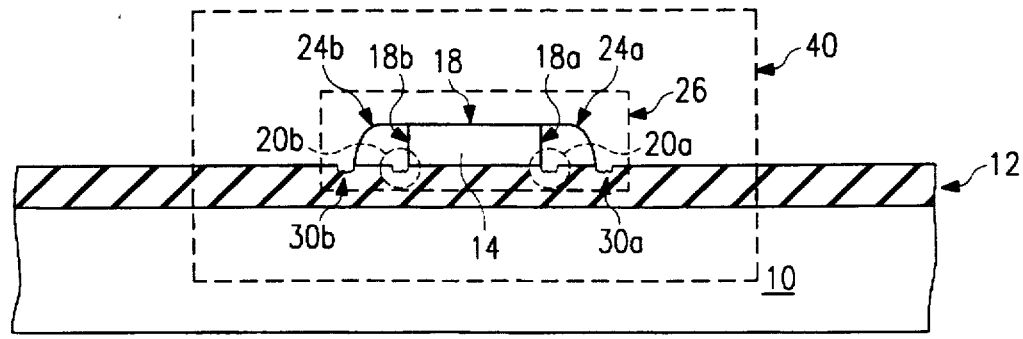

FIG. 1a shows the substrate 10, as p-type silicon which may have 7–10 ohm-cm resistivity, and on which an approximately 90 Å thick gate oxide (12) may be grown at 850° C. A polysilicon layer 14 may be formed over gate oxide 12 and may be doped with phosphorous, for example by implantation or by $POCl_3$ furnace doping. A resist 16 is then applied and patterned. In FIG. 1b, a gate 18 has been formed by etching away the portion of polysilicon layer 14 that is not covered by resist 16. The etch may consist of a $Cl_2$/HBr (45:15 sccm) bulk etch with an over-etch of HBr rich $Cl_2$/HBr (15:45 sccm) mixture. This etch step may result in damage to gate oxide 12 in a gate peripheral area 20, shown as 20a and 20b, that is, in regions which are at or adjacent to the periphery of the gate 18. In FIG. 1c, resist 16 has been removed with a cleanup such as Nanostrip and SC-1. In FIG. 1d, a polysilicon layer 22 has been deposited on gate 18 and may be doped with phosphorous, for example by implantation or by $POCl_3$ furnace doping.

In FIG. 1e, sidewalls 24a and 24b have been formed by a maskless sidewall etch of blanket polysilicon 22 which removes all of the blanket polysilicon 22 except the sidewalls 24a and 24b. Sidewalls 24a and 24b are in electrical contact with gate 18 and form together with gate 18 a modified gate 26 that covers the peripheral gate oxide areas 20a and 20b that may have been damaged during the gate etch step. Polysilicon and oxide that form on the backside of the wafer as a byproduct of the fabrication process just described are removed and the wafer is subjected to automated breakdown testing by placing a voltage across modified gate 26 and substrate 10, which comprise the MMOS capacitor 40 of this invention. C-V and I-V measurements may also be performed on these MMOS capacitors.

Still referring to FIG. 1e, sidewall 24 advantageously extends the conductive area of gate 18 over the periphery region 20 that may contain oxide damage. Sidewall 24 will displace atmospheric air and fill thin areas of oxide or microtrenches located in region 20 with conductive sidewall 24 material. Air is a good insulator, so air must be replaced with conductive material in order to accurately determine the thickness of the oxide 12 in region 20 by means of voltage breakdown testing. Sidewall 24 advantageously places modified gate 26 closer, corresponding to the amount of damage to oxide 12, to conductive substrate 10 in region 20 where oxide damage is present and advantageously maintains the same distance between modified gate 26 and conductive substrate 10 if no oxide damage is present in peripheral region 20. Gate oxide damage in the peripheral areas 20a and 20b will result in a lower breakdown voltage than would occur in undamaged gate oxide. The amount of drop in breakdown voltage is approximately proportional to the severity of the gate oxide damage due to the known principle that the breakdown voltage of an insulator is proportional to the thickness of the insulator. For a given thickness of undamaged gate oxide, the breakdown voltage is known or can be determined experimentally. Therefore, by measuring the actual breakdown voltage of MMOS capacitor 40, the presence and severity of oxide damage in the peripheral areas 20a and 20b can be ascertained.

Still referring to FIG. 1e, it is noted that during the etch step that forms sidewalls 24a and 24b, additional oxide damage may be inflicted in the new peripheral areas 30a and 30b. This damage may have a slight secondary effect on the breakdown voltage of MMOS capacitor 40, but due to the insulative properties of the atmospheric air which fills voids or damage in oxide 12 in region 30 the effect is minimal.

Figure 2A:
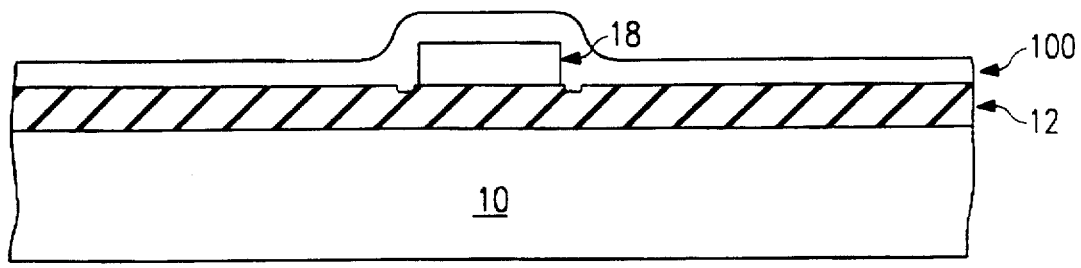
FIGS. 2a–2b are cross-sectioned elevational views of a semiconductor substrate illustrating an alternate method of constructing a modified MOS capacitor according to the present invention using a masked etch.
Figure 2B:
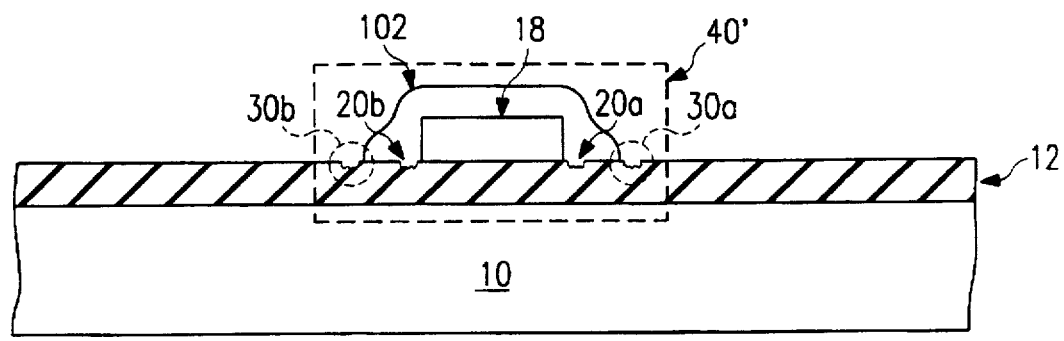

Forming sidewalls 24a and 24b using blanket polysilicon 22 and a maskless etch is convenient because no sidewall mask is required; however, for some applications, it may be more desirable to form sidewalls 24a and 24b in another manner. FIG. 2a shows a conductive layer 100, such as polysilicon, aluminum, copper or TiN, that is formed over gate 18. In FIG. 2b, a mask and etch step forms sidewall 102 that extends over peripheral oxide areas 20a and 20b which may contain oxide damage. The use of MMOS capacitor 40' formed in this manner is the same as MMOS capacitor 40.

Figure 3:
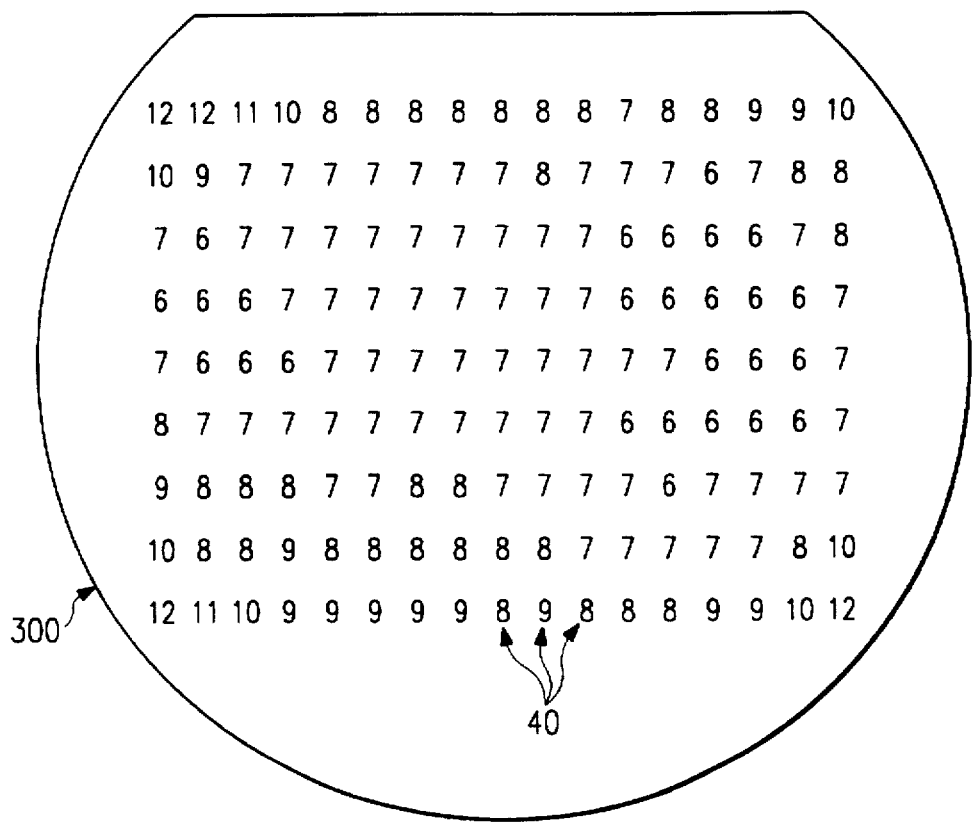
FIG. 3 is a plan view of a semiconductor wafer showing a typical array of modified MOS capacitors fabricated according to the current invention as illustrated in FIG. 1 or FIG. 2 and breakdown voltages associated with each.

MMOS capacitors 40, 40' may be used to evaluate a new process or a new etchant material. Experiments may be performed using various oxide thicknesses, gate thicknesses, etch rates, end point detection schemes, etchant formulations, different processing equipment, etc. using MMOS capacitors to determine the amount of oxide damage resulting from various combinations. For this purpose, an array of MMOS capacitors 40 or 40' may be formed on semiconductor wafer 300, as shown in FIG. 3. After processing, the breakdown voltage of each MMOS capacitor 40 or 40' is determined. FIG. 3 shows an example experiment in which the breakdown voltage of the various MMOS capacitors 40 or 40' ranges from 7v to 12v over the working area of wafer 300. This experiment indicates that more oxide damage generally exists in the center of the wafer 300 than in the regions surrounding the center and indicates a less than uniform process. With this type of information, the process engineer may determine ways to improve the fabrication process of, first, the MMOS capacitors 40 or 40' and ultimately integrated circuits having the same or similar materials and process steps.

Figure 4:
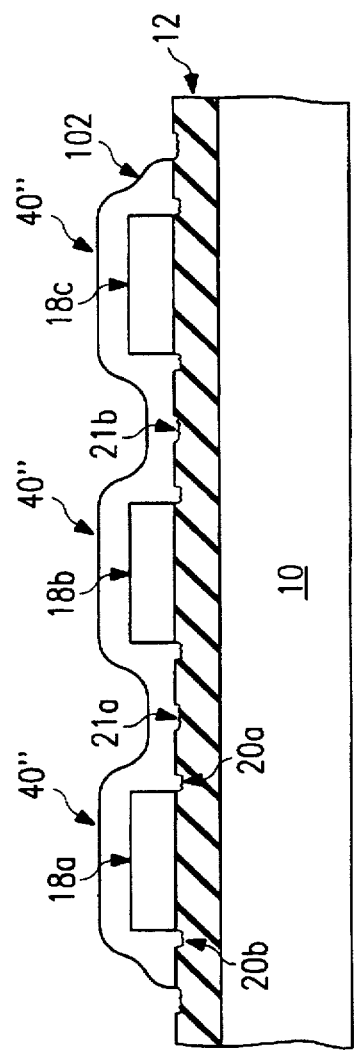
FIG. 4 is a cross-sectioned elevational view of a semiconductor substrate illustrating a single, multi-prong modified MOS capacitor fabricated according to the present invention as illustrated in FIG. 2.

Another embodiment of an MMOS capacitor is shown in FIG. 4. A sidewall 102 extends over several gates 18a–18c, for example, to form plural, electrically parallel MMOS capacitors 40". In this case, a breakdown voltage measurement of plural MMOS capacitors 40' indicates an occurrence of damage to oxide layer 12 in peripheral regions 20a or 20b of the gates 18a–18c, in inter-gate areas 21a or 21b, or anywhere in oxide 12 that is covered by sidewall 102.

Referring to FIG. 1e, FIG. 2b, and FIG. 4, the lower plate of MMOS capacitor 40, substrate 10, may be any conductive layer in a multilayer integrated circuit and oxide layer 12 may be any type of dielectric that may be subjected to damage during the formation of upper plate 18.

Figure 5A:
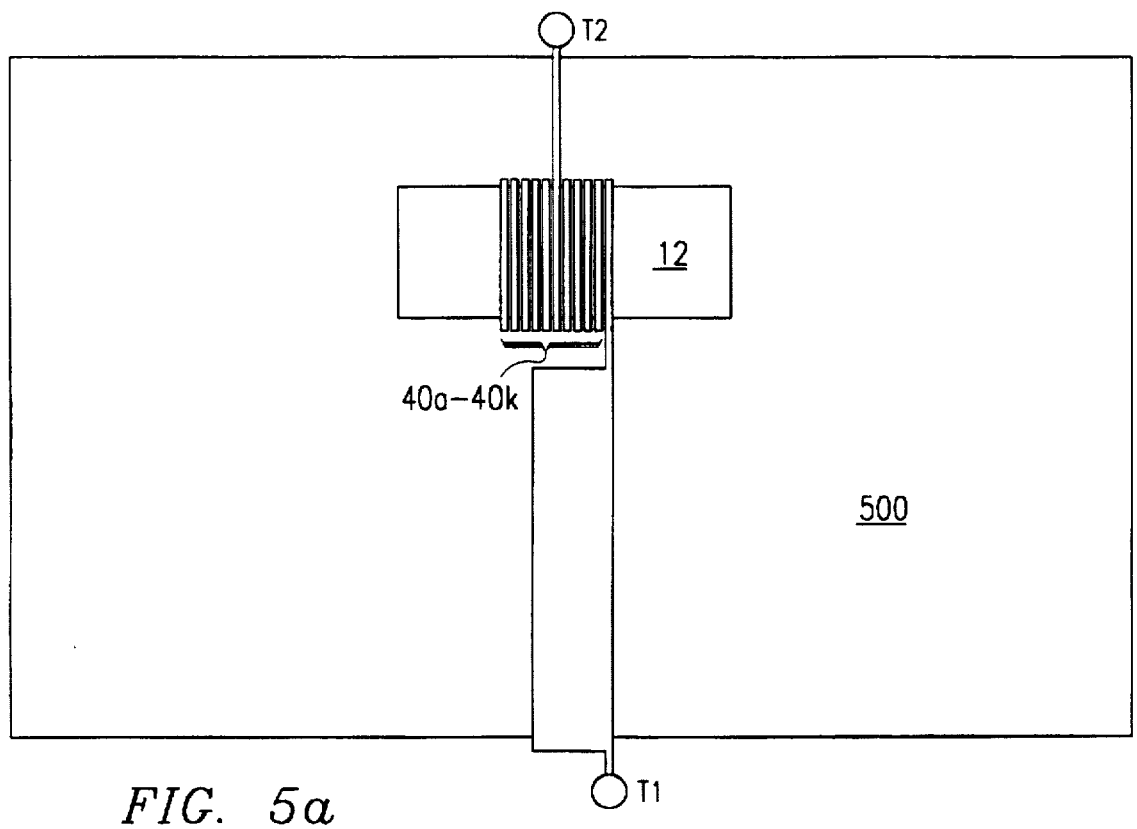
FIGS. 5a–5b are plan views of a semiconductor substrate showing alternate examples of multi-prong modified MOS capacitors fabricated according to the present invention as illustrated in FIG. 1 or FIG. 2.

Another embodiment of an MMOS capacitor is shown in FIG. 5a. Gate oxide 12 has several MMOS capacitors 40, 40a–40k, for example, having gates 18 formed as closely spaced parallel fingers. A field oxide 500, which may be formed over substrate 10 and overlaid with gate oxide 12, is much thicker than gate oxide 12, so that only the effects of an etchant on gate oxide 12 are affected by the voltage tests. When multiple gates 18 are located closely together, the action of an etchant may be affected, and more or less damage to gate oxide 12 may result due to the effects of the closely spaced gates 18. This is referred to as a "loading effect". A terminal T1 may be formed at the same time and as an extension of gate 18k. A voltage probe may be attached to terminal T1 to test MMOS capacitor 40k which has MMOS capacitor 40j located closely on one side but no gate 18 on the other side. A terminal T2 may be formed at the same time and as an extension of gate 18f, for example. A voltage probe may be attached to terminal T2 to test MMOS capacitor 40f, which has MMOS capacitors 40e and 40g located closely on either side. A test such as this is useful to determine the influence of the etchant loading effect and any resultant increased or decreased oxide damage when gate structures are located close together. Alternatively, the spacings between the MMOS capacitors 40a to 40k may be nonuniform and each one tested to determine loading effects as a function of varying spacing. A terminal, such as terminal T1 or terminal T2, may be formed at the same time and as an extension of each gate 18 for each MMOS capacitor 40, or a voltage probe may be touched directly to each MMOS capacitor 40.

Figure 5B:
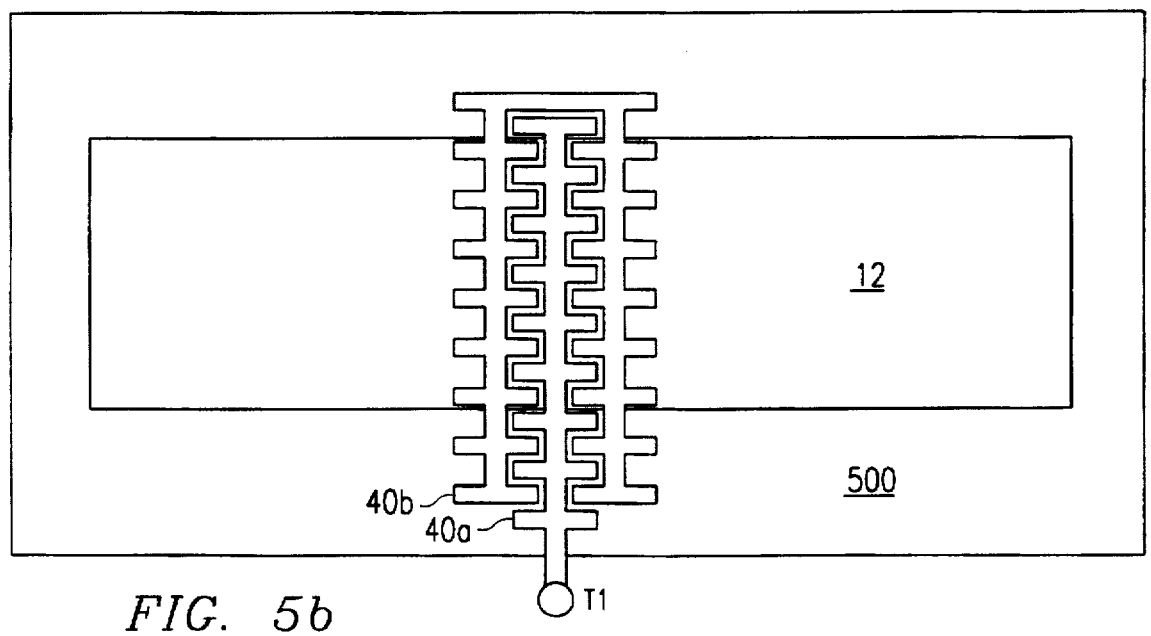

Another embodiment of an MMOS capacitor according to the present invention is shown in FIG. 5b. Gate oxide 12 has several MMOS capacitors 40, 40a–40b, for example, formed as closely spaced, complicated interlaced geometries. Field oxide 500 is much thicker than gate oxide 12, so that only the etchant effects on gate oxide 12 are affected by the voltage tests. Etchant loading effects due to complicated, closely spaced gate 18 geometries may be evaluated using MMOS capacitors 40. A terminal, such as terminal T1 which may be formed at the same time and as an extension of gate 18a, may be provided for MMOS capacitor 40a. A voltage may be connected to terminal T1 to test MMOS capacitor 40a, or a voltage probe may be touched directly to MMOS capacitor 40a. Similarly, a terminal such as T1 may be formed at the same time and as an extension of each gate 18. A voltage may be connected to each terminal T1 to test MMOS capacitors 40, or a voltage probe may be touched directly to each MMOS capacitor 40.

Figure 6:
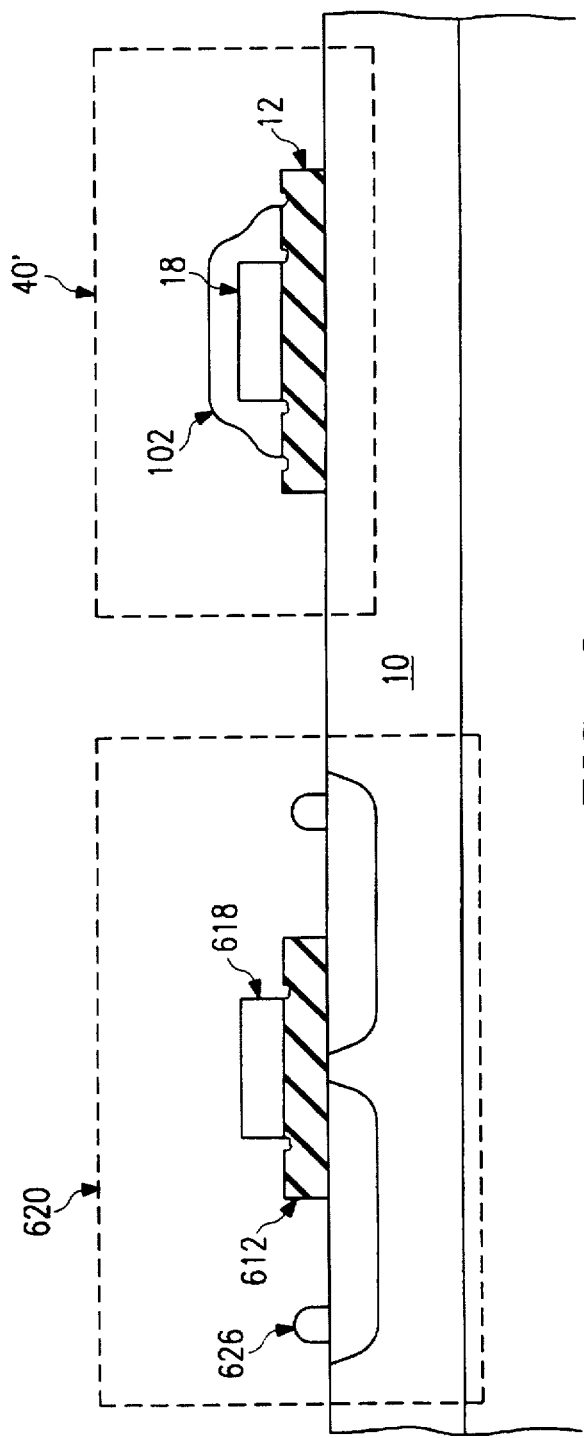
FIG. 6 is a cross-sectioned elevational view illustrating a MMOS capacitor formed according to the present invention as illustrated in FIG. 2 and an integrated circuit formed using the same processing steps in accordance with the present invention.

Another embodiment of MMOS capacitors is as a test structure on a wafer that contains integrated circuits that will be packaged and sold. In FIG. 6, substrate 10 contains at least one MMOS capacitor 40 and at least one integrated circuit 620. MMOS capacitor 40 is fabricated at the same time and by the same process steps (at least as to the layers depicted) as integrated circuit 620. A gate oxide 612 and oxide 12 may be advantageously formed in the same oxide growth step. A gate 618 and gate 18 may be advantageously formed by the same mask and etch step. Sidewall 22 can be formed in conjunction with any other conductive layer (metal or polysilicon), such as interconnect 626. When processing of integrated circuit 620 is completed, the breakdown voltage of MMOS capacitor 40 may be measured. The MMOS capacitor 40 that is tested is referred to as a unit under test (herein called "UUT"). A UUT breakdown voltage that is lower than expected for the thickness of gate oxide 12 indicates that oxide damage in the gate periphery 20a, 20b may have occurred. It can be inferred that if the oxide of UUT MMOS capacitor 40 is defective, then most likely the oxide 612 in the gate periphery of integrated circuit 620 is also defective. In this manner, integrated circuit 620 may tested for gate oxide damage non-destructively.

An advantage of the invention is that MMOS capacitor 40 may be used to investigate peripheral damage for any geometry and density, thus directly accounting for etchant loading effects.

Routine MOS electrical characterization may be performed on MMOS capacitors 40 to yield information on peripheral oxide damage.

Another advantage of the invention is that gate oxide 12 thickness, process parameters and layer 22 thickness may be varied to precisely determine the source of gate oxide damage. The width of the sidewall may be varied by varying the thickness of layer 22. The width of the sidewall may be made less than the thickness of the capacitor plate.

Another advantage is that MMOS capacitors 40 can be used to compare plasma chemistries, account for trenching, detect etchant loading and determine effects of process hardware changes.

MMOS capacitors 40 can be especially useful in regimes where optical measurement techniques are unreliable.

Another advantage of the invention is that it can be used to monitor a production process by including a UUT MMOS capacitor on each wafer or it can be used to evaluate a new process or etchant material.

As used herein, the terms "connected" and "connection" mean electrically connected, including where additional elements may be in the electrical connection path.

While the invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modifications of the embodiments as fall within the true scope and spirit of the invention.

What is claimed is:

1. A method for detecting damage to a dielectric on a semiconductor wafer caused by plasma etch comprising the steps of:

forming at least one MMOS capacitor on the wafer, the capacitor including the dielectric, and further comprising a conductive plate and a conductive sidewall which is electrically continuous with the conductive plate;

determining a breakdown voltage of the MMOS capacitor;

comparing the MMOS capacitor breakdown voltage to an expected breakdown voltage for undamaged dielectric, the existence of a dielectric defect being inferable if the MMOS capacitor breakdown voltage is less than the expected breakdown voltage.

2. The method of claim 1, further comprising:

determining that a dielectric defect is present in the dielectric under the conductive plate and the conductive sidewall when the MMOS capacitor breakdown voltage is less than the expected breakdown voltage; and determining the proportional reduction of the MMOS capacitor breakdown voltage to the expected breakdown voltage to indicate a severity of the defect.

3. The method of claim 1, in which the step of forming an MMOS capacitor comprises:

provuling a conductive substrate;

forming the dielectric over a portion of the substrate;

forming a conductive layer over a portion of the dielectric;

forming the conductive plate by etching the conductive layer using a plasma etch;

partially etching a portion of the dielectric immediately surrounding the conductive plate as a result of forming the plate;

forming a conductive sidewall connected to the conductive plate over the portion of partially etched dielectric, the conductive plate and the conductive sidewall together forming an electrode that is usable to determine the breakdown voltage of the dielectric.

4. The method of claim 1, wherein a plurality of MMOS capacitors are formed each with a separate conductive plate, and wherein a single conductive sidewall is continuous with all of the separate conductive plates of the plurality of MMOS capacitors.

5. The method of claim 1, wherein the step of forming forms a plurality of MMOS capacitors in an array spaced apart over a working area of the semiconductor wafer, and wherein the step of determining a breakdown voltage is performed on each of the plurality of MMOS capacitors; and further comprising:

plotting the breakdown voltage of each of the plurality of MMOS capacitors to form a plot of breakdown voltages in a manner to correspond to the working area of the semiconductor wafer; and improving a fabrication process used during the step of forming the plurality of MMOS capacitors in response to the plot of breakdown voltages.

6. The method of claim 1, wherein the step of forming forms at least two MMOS capacitors, such that a first MMOS capacitor has a first conductive plate and a second MMOS capacitor has a second conductive plate, and wherein the first conductive plate and the second conductive plate are formed as closely spaced interlaced geometry's.

7. A method for testing an integrated circuit to detect damage to a dielectric caused by plasma etch, comprising the steps of:

providing a conductive substrate;

forming at least one area of a test dielectric for an MMOS capacitor over the conductive substrate while simultaneously forming at least one area of a functional dielectric for a functional MOS device;

forming with a plasma etch a conductive plate of the MMOS capacitor over a portion the test dielectric while simultaneously forming a conductive element of the functional MOS device over a portion of the functional dielectric;

partially etching a portion of the test dielectric immediately surrounding the conductive plate as a result of forming the plate while simultaneously partially etching a portion of the dielectric immediately surrounding the conductive element of the functional MOS device as a result of forming the conductive element;

forming on the MMOS capacitor a conductive sidewall which is electrically continuous with the conductive plate and is located over a portion of the partially etched test dielectric, the conductive plate and the conductive sidewall together forming an electrode that is usable to determine a breakdown voltage of the MMOS capacitor;

determining the breakdown voltage of the MMOS capacitor;

comparing the breakdown voltage of the MMOS capacitor to an expected breakdown voltage for undamaged test dielectric; and predicting that a dielectric defect is present in the partially etched portion of dielectric immediately surrounding the conductive element of the functional MOS device when the breakdown voltage of the MMOS capacitor is less than the expected breakdown voltage of undamaged test dielectric.

8. A method for evaluating a process for fabricating an integrated circuit on a semiconductor wafer, comprising the steps of:

forming at least a first MMOS capacitor on a first semiconductor wafer using a first process having a first plurality of process parameters, the first MMOS capacitor including a dielectric, and further comprising a conductive plate and a conductive sidewall which is electrically continuous with the conductive plate;

determining a breakdown voltage of the first MMOS capacitor;

forming at least a second MMOS capacitor on a second semiconductor wafer using a second process having a second plurality of process parameters, wherein the second plurality of process parameters is different from the first plurality of process parameters;

determining a breakdown voltage of the second MMOS capacitor; and comparing the first process and the second process based on the breakdown voltage of the first MMOS capacitor and the second MMOS capacitor.

* * * * *